United States Patent [19]
Adomi et al.

[11] Patent Number: 5,444,269
[45] Date of Patent: Aug. 22, 1995

[54] ALGAINP LIGHT EMITTING DEVICE

[75] Inventors: Keizo Adomi; Nobuhiko Noto; Takao Takenaka, all of Annaka, Japan

[73] Assignee: Shin-Etsu Handotai Co., Ltd., Tokyo, Japan

[21] Appl. No.: 251,370

[22] Filed: May 31, 1994

[30] Foreign Application Priority Data

May 31, 1993 [JP] Japan .................. 5-154169

[51] Int. Cl.$^6$ ............................. H01L 33/00
[52] U.S. Cl. ................... 257/094; 257/96; 257/97; 257/103; 372/45; 372/46
[58] Field of Search ............. 257/94, 95, 96, 97, 257/103, 90; 372/45, 46

[56] References Cited

U.S. PATENT DOCUMENTS

| | | | |
|---|---|---|---|
| 4,288,757 | 9/1981 | Kajimura | 372/45 |
| 4,494,237 | 1/1985 | Di Forte Poisson et al. | 257/94 X |
| 4,706,255 | 11/1987 | Thornton et al. | 372/50 |
| 4,727,557 | 2/1988 | Burnham et al. | 257/22 X |
| 5,008,718 | 4/1991 | Fletcher et al. | 257/96 |
| 5,091,757 | 2/1992 | Yoshida | 257/95 X |
| 5,202,285 | 4/1993 | Jugano et al. | 257/79 X |

FOREIGN PATENT DOCUMENTS

| | | | |
|---|---|---|---|
| 0434233 | 6/1991 | European Pat. Off. | H01L 33/00 |
| 04017632 | 6/1990 | Germany | H01L 33/00 |
| 1243483 | 9/1989 | Japan | 257/96 |
| 4229665 | 8/1992 | Japan | 257/97 |

OTHER PUBLICATIONS

K. H. Huang et al., Applied Physics Letters, vol. 61, No. 9, pp. 1045–1047, Aug. 31, 1992.

*Primary Examiner*—William Mintel
*Attorney, Agent, or Firm*—Ronald R. Snider

[57] ABSTRACT

An AlGaInP double heterojunction structure or an AlGaInP single heterojunction structure is formed on a first conductivity-type GaAs substrate, and then a layer made of a second conductivity-type $Al_wGa_{1-w}As_{1-v}P_v$ mixed crystal ($Al_{0.7}Ga_{0.3}As_{0.97}P_{0.03}$, for example) which has the bandgap energy larger than the energy of photon emitted from the active layer of said light emitting layer portion, and has good lattice-matching with $(Al_BGa_{1-B})_{0.51}In_{0.49}P$ mixed crystal (layer) constituting said light emitting layer portion, is formed as a current spreading layer on top of said light emitting layer portion. Here, w and v are in the range of $0.45 \leq w < 1$ and $0 < v \leq 0.08$, respectively.

4 Claims, 4 Drawing Sheets

| | CURRENT SPREADING LAYER | | BRIGHTNESS (RELATIVE VALUE) | LIFE | WARPING OF THE EPITAXIAL WAFER ($\mu m$) |
|---|---|---|---|---|---|
| | MATERIAL | THICKNESS ($\mu m$) | | | |
| EXAMPLES | $Al_{0.7}Ga_{0.3}As_{0.97}P_{0.03}$ | 1 | 33 | — | 0~3 |
| | | 2 | 54 | — | |
| | | 3 | 96 | 85~90 | |
| | | 5 | 100 | | |
| | | 8 | 105 | | |
| | | 15 | 107 | | 5 |
| COMPARATIVE EXAMPLES | $Al_{0.7}Ga_{0.3}As$ | 3 | 97 | 67~70 | 80 |
| | | 5 | 98 | | 125 |
| | | 8 | 93 | | 150 |

FIG.4

ALGAINP LIGHT EMITTING DEVICE

FIELD OF THE INVENTION

1. Background of the Invention

This invention relates to a compound semiconductor light emitting device, and more precisely to an AlGaInP light emitting device which has an active layer made of AlGaInP mixed crystals.

2. The Prior Art

AlGaInP-type materials are direct tansition-type materials with the largest bandbap energies among III–V group compound semiconductor mixed crystals, with the exception of nitrides, and are receiving much attention as materials for visible light emitting devices in the 550–650 nm band (green to red region). An AlGaInP light emitting device, which has an active layer made of AlGaInP with such a large direct bandgap energy, can produce light emission with much higher brightness than the conventional ones using indirect transition-type materials such as GaP and GaAsP.

FIG. 3 shows a schematic cross section of one example of conventional AlGaInP light emitting devices. This AlGaInP light emitting device 10 has the following structure: An n-type $(Al_xGa_{1-x})_{0.51}In_{0.49}P$ cladding layer 12 (approximately 1 micrometer thick), an $(Al_yGa_{1-y})_{0.51}In_{0.49}P$ active layer 13 (approximately 0.6 micrometers thick), a p-type $(Al_zGa_{1-z})_{0.51}In_{0.49}P$ cladding layer 14 (approximately 1 micrometer thick) and a p-type current spreading layer (a p-type layer to spread current effectively) 15 (several micrometers thick) are formed, one after another, on an n-type GaAs substrate 11, and a p-side electrode (top surface electrode) 16 and an n-side electrode (bottom surface electrode) 17 are provided on said p-type current spreading layer 15 and on the bottom surface of the n-type GaAs substrate 11, respectively.

Here, the AlGaInP double heterojunction structure comprising the $(Al_yGa_{1-y})_{0.51}In_{0.49}P$ active layer 13 and the two AlGaInP cladding layers which have the bandgap energies larger than that of said active layer 13, i.e. the n-type $(Al_xGa_{1-x})_{0.51}In_{0.49}P$ cladding layer 12 and the p-type $(Al_zGa_{1-z})_{0.51}In_{0.49}P$ cladding layer 14, constitutes the light emitting layer portion 18, and said $(Al_yGa_{1-y})_{0.51}In_{0.49}P$ active layer 13 functions as the light emitting layer. The ratios of Al composition, i.e. x, y and z, in the AlGaInP layers which constitute said AlGaInP double heterojunction structure satisfy the following relationships: $0 \leq y \leq 0.7$, $y < x$, and $y < z$.

Hereafter, if there are no special reasons, said $(Al_xGa_{1-x})_{0.51}In_{0.49}P$, $(Al_yGa_{1-y})_{0.51}In_{0.49}P$ and $(Al_zGa_{1-z})_{0.51}In_{0.49}P$ are generically called "$(Al_BGa_{1-B})_{0.51}In_{0.49}P$", or abbreviated as "AlGaInP".

An AlGaInP light emitting device such as described above requires a current spreading layer, and more specifically it requires a current spreading layer made of materials different from AlGaInP mixed crystals. The reasons for this are explained next by referring to FIG. 3. Arrows in FIG. 3 indicate the distribution of current 19 from the p-side electrode 16.

In light emission of an AlGaInP light emitting device, it is desirable to spread the current effectively from the p-side electrode 16 into the whole area of the AlGaInP active layer 13, which is the light emitting layer, so that enough efficient light emission occurs. In order to achieve this, it is required that the distance (layer thickness) between said p-side electrode 16 and the AlGaInP active layer 13 should be a prescribed length (several micrometers) or more.

In the case of an AlGaInP light emitting device which has an active layer comprising AlGaInP, as shown in FIG. 3, said AlGaInP layers 12 (approximately 1 micrometer thick), 13 (approximately 0.6 micrometers thick) and 14 (approximately 1 micrometer thick) with a generic composition of $(Al_BGa_{1-B})_{0.51}In_{0.49}P$ are formed on the GaAs substrate 11, wherein said AlGaInP layers are lattice-matched with said GaAs substrate 11. However, it is very difficult to form $(Al_BGa_{1-B})_{0.51}In_{0.49}P$ mixed crystal layers of a total thickness exceeding 3 micrometers without compromising the crystallinity.

That is, in order to spread the current effectively from the p-side electrode 16 into the whole area of the AlGaInP active layer 13, the thickness between the p-side electrode 16 and said active layer 13 must be several micrometers or more. However, because of the reason described above, it is almost impossible to form a layer of this thickness using AlGaInP materials.

Therefore, conventionally it has been a practice to form, as a current spreading layer 15, a layer made of materials different from AlGaInP on said p-type AlGaInP cladding layer 14 and thus spread the current effectively from the p-side electrode 16 into the whole area of said AlGaInP active layer 13 so as to obtain enough efficient light emission.

As materials for said current spreading layer 15, based on the requirement that photons emitted from said AlGaInP active layer 13 should not be absorbed, $Al_wGa_{1-w}As$ ($0.45 \leq w < 1$) or GaP, which have the bandgap energies larger than the energy of said photons, have been conventionally used.

However, since GaP has a large lattice-mismatching with $(Al_BGa_{1-B})_{0.51}In_{0.49}P$, $Al_wGa_{1-w}As$ which has nearly the same lattice constant as that of $(Al_BGa_{1-B})_{0.51}In_{0.49}P$ is mainly used.

BRIEF SUMMARY OF THE INVENTION

However, even when $Al_wGa_{1-w}As$ is used for the current spreading layer, if w, the ratio of Al composition, is increased for the purpose of increasing the bandgap energy, the lattice-mismatching with said $(Al_BGa_{1-B})_{0.51}In_{0.49}P$ mixed crystals (layers) which constitute the light emitting layer portion formed on said GaAs substrate cannot be ignored.

For example, when the light emitting wavelength is 590 nm, in order that the photons emitted from said AlGaInP active layer 13 travel through the $Al_wGa_{1-w}As$ current spreading layer 15 almost without absorption, it is necessary to keep w, the ratio of Al composition in $Al_wGa_{1-w}As$ used for the current spreading layer 15, at approximately 0.7 or higher. However, at this level of w, the ratio of the lattice-mismatch between $Al_wGa_{1-w}As$ and $(Al_BGa_{1-B})_{0.51}In_{0.49}P$ at room temperature is 0.1% or higher.

By referring to the structure shown in FIG. 3, the ratio of lattice-mismatch is expressed by the following equation:

$$\text{Ratio of the lattice-mismatch} = \frac{a' - a}{a} \times 100 \ (\%)$$

a': Lattice constant of $Al_wGa_{1-w}As$ used for the current spreading layer 15 a: Lattice constant of $(Al_zGa_{1-z})_{0.51}In_{0.49}P$ used for the p-type cladding layer 14

When the ratio of the lattice-mismatch becomes higher as described above, stress caused by the lattice-mismatch occurs inside, and this stress affects said light emitting layer portion 18, particularly the AlGaInP active layer 13 which plays the primary role in light emission. Because of this, there was a problem in that the device characteristics, particularly the light emission characteristics, deteriorate when a light emitting operation was carried out over a long term. In other words, there was a problem in that the life of the device was short.

Also, there was another problem in that warping occurs in the epitaxial wafers used to manufacture said AlGaInP light emitting device, owing to the influence of said stress, thus affecting the process of making it into elements for practical use.

Therefore, the object of this invention is to provide an AlGaInP light emitting device which has a current spreading layer lattice-matching well with said $(Al_B Ga_{1-B})_{0.51} In_{0.49} P$ mixed crystals (layers) constituting the light emitting layer portion.

That is, the object of this invention is to provide an AlGaInP light emitting device which has a long life and high reliability, showing no deterioration of the light emitting characteristics even by a light emitting operation over a long term.

BRIEF DESCRIPTION OF THE DRAWINGS

FIG. 4 is a table showing characteristics of AlGaInP devices.

DETAILED DESCRIPTION

Figure 1:
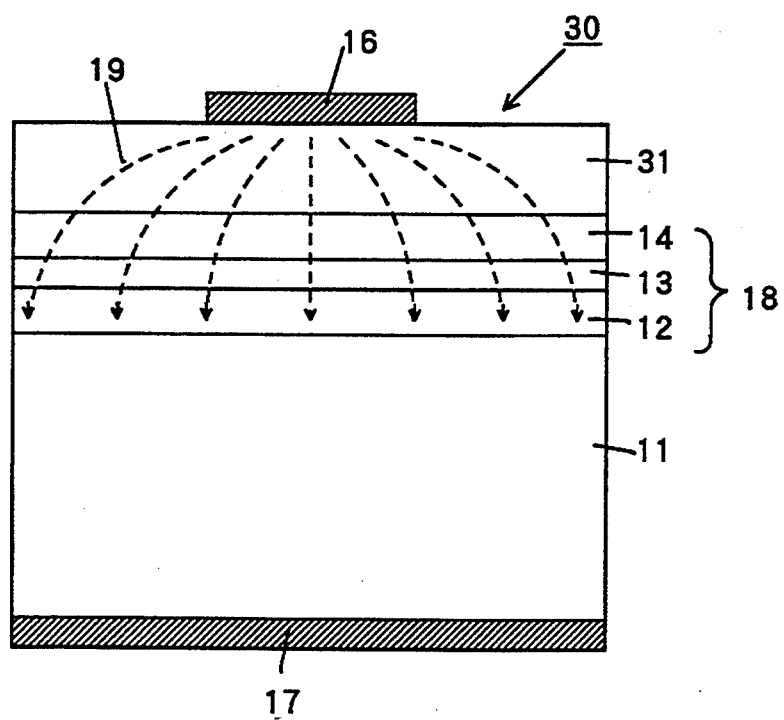
FIG. 1 shows a schematic cross section of one example of the AlGaInP light emitting device of this invention.

In the AlGaInP light emitting device of this invention, a light emitting layer portion made of an AlGaInP double heterojunction structure or an AlGaInP single heterojunction structure is formed on a first conductivity-type GaAs substrate, and then a layer made of a second conductivity-type $Al_w Ga_{1-w} As_{1-v} P_v$ mixed crystal ($Al_{0.7} Ga_{0.3} As_{0.97} P_{0.03}$, for example) which has the bandgap energy larger than the energy of photon emitted from the active layer of said light emitting layer portion, and has very good lattice-matching with the $(Al_B Ga_{1-B})_{0.51} In_{0.49} P$ mixed crystals (layers) constituting said light emitting layer portion, is formed as a current spreading layer on top of said light emitting layer portion. Here, w and v are in the range of $0.45 \leq w < 1$ and $0 < v \leq 0.08$, respectively.

The thickness of said $Al_w Ga_{1-w} As_{1-v} P_v$ current spreading layer must be 3 micrometers or more in order to diffuse current effectively, and the thicker it is, the higher the brightness will be.

An example of the heterojunction structure of said light emitting layer portion would be a double heterojunction structure comprising a first conductivity-type cladding layer made of the $(Al_x Ga_{1-x})_{0.51} In_{0.49} P$ mixed crystal, an active layer made of the $(Al_y Ga_{1-y})_{0.51} In_{0.49} P$ mixed crystal and a second conductivity-type cladding layer made of the $(Al_z Ga_{1-z})_{0.51} In_{0.49} P$ mixed crystal. Here, x, y and z are set to satisfy the following relationships: $0 \leq y \leq 0.7$, $y < x$, and $y < z$. Said w and v are set in the range of $0.45 \leq w < 1$ and $0 < v \leq 0.08$, respectively.

A single heterojunction structure comprising an active layer made of the $(Al_y Ga_{1-y})_{0.51} In_{0.49} P$ mixed crystal and a second conductivity-type cladding layer made of the $(Al_z Ga_{1-z})_{0.51} In_{0.49} P$ mixed crystal can also be used. In this case, y and z are set to satisfy the following relationships: $0 \leq y \leq 0.7$ and $y < z$. Said w and v are set in the range of $0.45 \leq w < 1$ and $0 < v \leq 0.08$, respectively.

A specific example of mixed crystal which is in perfect lattice-matching with $(Al_B Ga_{1-B})_{0.51} In_{0.49} P$ constituting the light emitting layer portion would be $Al_{0.7} Ga_{0.3} As_{1-v} P_v$ mixed crystal with v of approximately 0.025.

In the AlGaInP light emitting device of this invention, the current spreading layer provided between the light-emitting-side electrode (top surface electrode) and the AlGaInP light emitting layer portion is made of $Al_w Ga_{1-w} As_{1-v} P_v$ mixed crystal which is in very good lattice-matching with the $(Al_B Ga_{1-B})_{0.51} In_{0.49} P$ mixed crystals (layers) constituting said light emitting layer portion. Therefore it is possible to significantly reduce the stress caused by the lattice-mismatch between the layers.

This reduction of the internal stress makes it possible not only to sufficiently extend the life of said light emitting device but also to significantly reduce warping of the AlGaInP epitaxial wafer used for manufacturing said light emitting device.

The AlGaInP light emitting device of this invention is described below by referring to FIG. 1 and FIG. 2. For the layer structure of the light emitting layer portion, there are, as described above, the AlGaInP double heterojunction structure, the AlGaInP single heterojunction structure and such. However, since the layer structure of the light emitting layer portion is not essential for discussing formation of the current spreading layer, which is the subject of this invention, we have chosen the AlGaInP light emitting devices which have the AlGaInP double heterojunction structure for the purpose of description.

Figure 3:
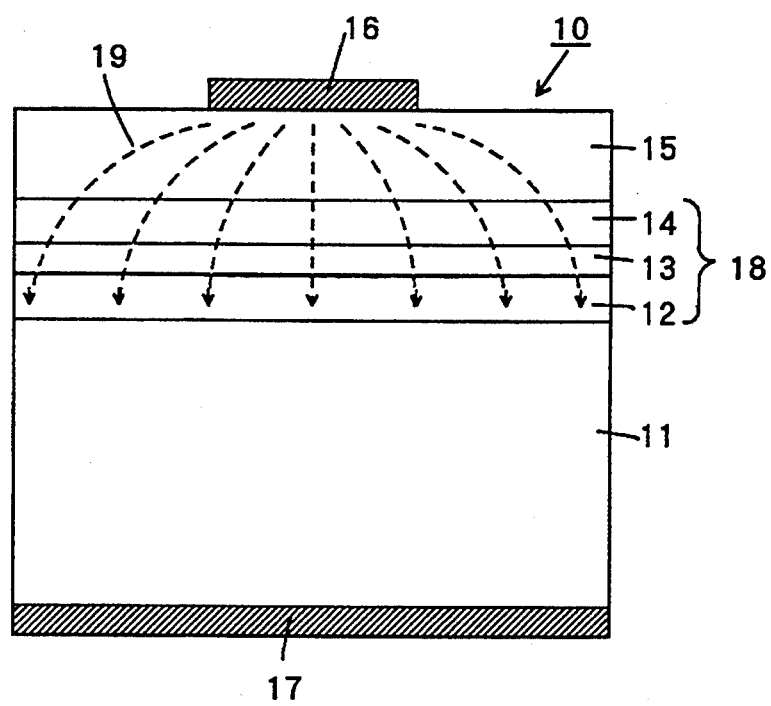
FIG. 3 shows a schematic cross section of one example of conventional AlGaInP light emitting devices.

FIG. 1 shows a schematic cross section of one example of the AlGaInP light emitting device of this invention. In FIG. 1, those parts which have identical counterparts in FIG. 3 have the same symbols as used in FIG. 3. This light emitting device 30 has the following structure: An n-type $(Al_{0.7} Ga_{0.3})_{0.51} In_{0.49} P$ cladding layer 12 (approximately 1 micrometer thick), an $(Al_y Ga_{1-y})_{0.51} In_{0.49} P$ active layer 13 ($0 \leq y \leq 0.7$, approximately 0.6 micrometers thick), a p-type $(Al_{0.7} Ga_{0.3})_{0.51} In_{0.49} P$ cladding layer 14 (approximately 1 micrometer thick) and a p-type $Al_{0.7} Ga_{0.3} As_{0.97} P_{0.03}$ current spreading layer 31 (3 micrometers thick or thicker) are formed, one after another, on an n-type GaAs substrate 11, and a p-side electrode 16 and an n-side electrode 17 are provided on said p-type current spreading layer 31 and on the bottom surface of the n-type GaAs substrate 11, respectively.

For the method of growing the AlGaInP layers (the active layer and the cladding layers) and the AlGaAsP layer (current spreading layer), the MOVPE method is adopted. As the material source for Al, Ga, In, As and P, trimethyl aluminum ($Al(CH_3)_3$), trimethyl gallium ($Ga(CH_3)_3$), trimethyl indium ($In(CH_3)_3$), arsine ($AsH_3$) and phosphine ($PH_3$), respectively, are used. As the n-type and p-type dopant sources, hydrogen selenide ($H_2Se$) and dimethyl zinc ($Zn(CH_3)_2$), respectively, are used.

Figure 2:
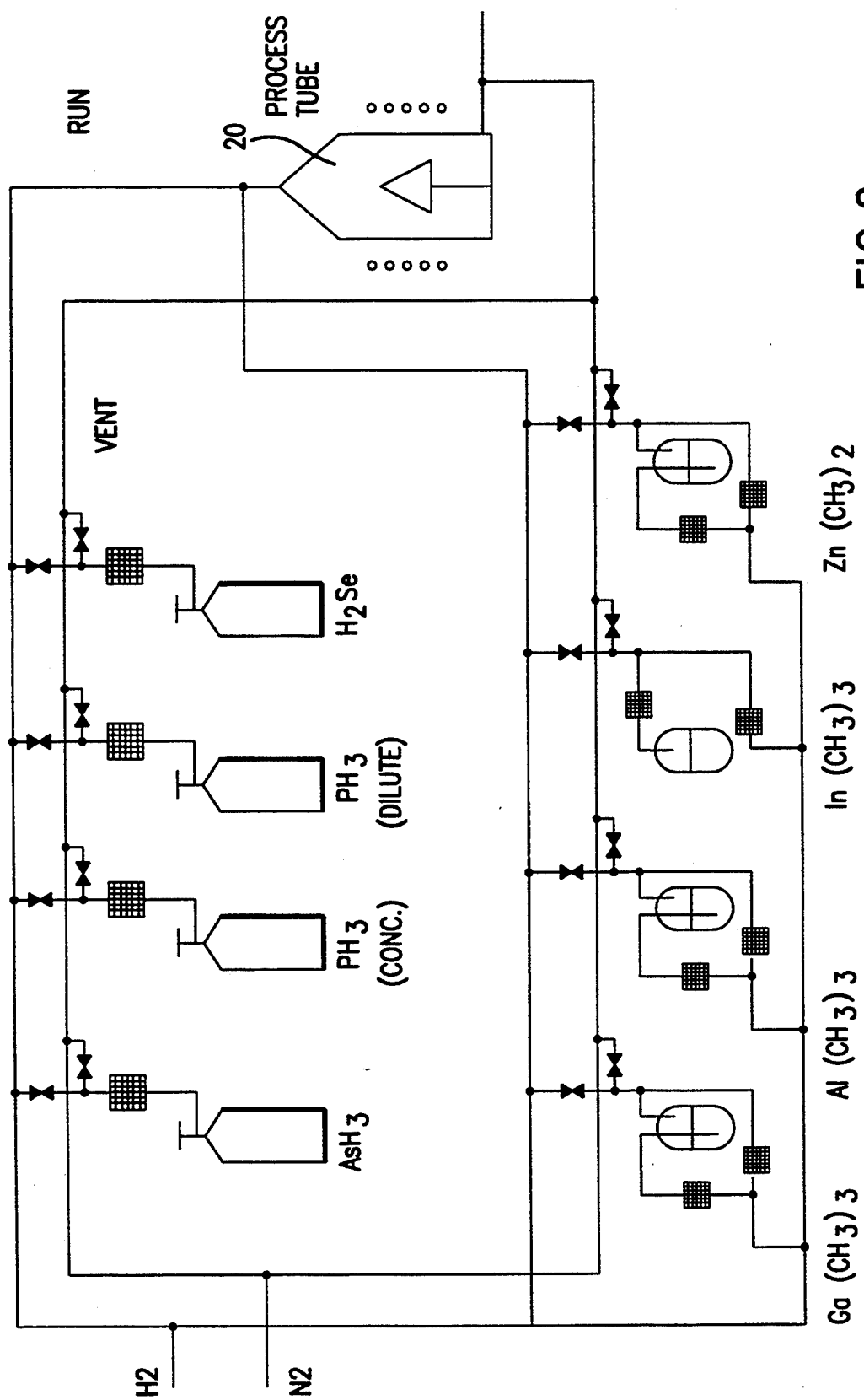
FIG. 2 shows a configuration example of the growth apparatus used for growing the layers by means of the MOVPE method.

FIG. 2 shows a configuration example of a growth apparatus used for growing the layers by means of the MOVPE method. Various vapors of metalorganic compounds of Group III metals and hydride gases of Group V elements are mixed and the obtained mixed-gas is fed into a process tube 20, with partial pressures and flow rates adjusted according to the composition of the growing layer, and then the desired growing layers are formed, one after another, on the n-type GaAs substrate 11 which is placed in the process tube 20.

Specifically, with a pressure of 50 torr, said layers 12, 13, 14 and 31 are formed on the n-type GaAs substrate 11, by supplying mixed source gases prepared in such a way that the supply ratio of the Group V element(s) and the Group III element(s) (V/III ratio) is 100, under the following growth conditions: a growth temperature of 710° C. and a growth rate of 4 micrometers/hour. The epitaxial wafer thus obtained is made into elements to obtain the AlGaInP light emitting device 30 shown in FIG. 1.

When growing said p-type $Al_{0.7}Ga_{0.3}As_{0.97}P_{0.03}$ current spreading layer 31, it is necessary to precisely control the concentration of $PH_3$, the material source for P, and, when the growth of the p-type $(Al_{0.7}Ga_{0.3})_{0.51}In_{0.49}P$ cladding layer 14 switches to the growth of said p-type $Al_{0.7}Ga_{0.3}As_{0.97}P_{0.03}$ layer 31, it is necessary to abruptly reduce the flow rate of $PH_3$. With this consideration, it is preferable to have two or more $PH_3$ supply lines, as shown in FIG. 2.

The table in FIG. 4 shows various characteristics of the AlGaInP light emitting devices and the epitaxial wafers used for manufacturing said AlGaInP light emitting devices of this invention for which the $Al_{0.7}Ga_{0.3}As_{0.97}P_{0.03}$ mixed crystal is used for the current spreading layer, in comparison with those of the comparative example. The AlGaInP light emitting devices of the comparative example is the same as those for the example except for the fact that $Al_{0.7}Ga_{0.3}As$ mixed crystal is used as the material for the current spreading layer.

The table in FIG. 4 indicates the following:

The example indicates that enough high brightness can be obtained when the thickness of the current spreading layer is 3 micrometers or more, and that the brightness becomes higher as the thickness of the current spreading layer increases. That is, if the thickness of the current spreading layer is 3 micrometers or more, the current from the p-side electrode 16 is effectively spread over the whole area of the active layer, resulting in enough efficient light emission. On the other hand, the comparative example indicates that, due to the stress caused by the lattice-mismatch, the brightness decreases, rather than increases, as the thickness of the current spreading layer increases.

The AlGaInP light emitting device of this example has a much improved life and the epitaxial wafer used for manufacturing said AlGaInP light emitting device has less warping, when compared with conventional ones. Based on this finding, it can be said that, by forming, on top of the light emitting layer portion 18, the current spreading layer 31 made of $Al_wGa_{1-w}As_{1-v}P_v$ mixed crystal which has very good lattice-matching with the $(Al_BGa_{1-B})_{0.51}In_{0.49}P$ mixed crystal (layer) constituting said light emitting layer portion 18, it is possible to significantly reduce the stress caused by the lattice-mismatch.

Based on the results described above, it can be said that the AlGaInP light emitting device of this invention is a light emitting device which has high brightness, i.e. effective current spreading, as well as a long life and high reliability.

The example described above used, as an example, an AlGaInP light emitting device comprising an n-type cladding layer, an active layer, a p-type cladding layer and a p-type current spreading layer formed, one after another, on an n-type GaAs substrate. However, it is also possible to form a p-type cladding layer, an active layer, an n-type cladding layer and an n-type current spreading layer, one after another, on a p-type GaAs substrate. Furthermore, instead of using such double heterojunction structures, a single heterojunction structure can also be used. Needless to say, the conditions in the example described above can be changed within the range which is consistent with the purpose of this invention.

As described thus far, this invention, by providing a current spreading layer which is in good lattice-matching with the $(Al_BGa_{1-B})_{0.51}In_{0.49}P$ layers constituting said light emitting layer portion, makes it possible to obtain an AlGaInP light emitting device which has a long life and high reliability, showing no deterioration of the light emitting characteristics even by a light emitting operation over a long term.

What is claimed is:

1. An AlGaInP light emitting device comprising a light emitting layer portion made of AlGaInP heterojunction structure formed on a first conductivity-type GaAs substrate, wherein said AlGaInP heterojunction structure is selected from the group consisting of an AlGaInP double heterojunction structure and an AlGaInP single heterojunction structure, characterized by the fact that a second conductivity-type $Al_wGa_{1-w}As_{1-v}P_v$ current spreading layer which has the bandgap energy larger than the energy of the photon emitted from the active layer of said light emitting layer portion is provided on top of said light emitting layer portion.

2. An AlGaInP light emitting device as described in claim 1, wherein the thickness of said second conductivity-type $Al_wGa_{1-w}As_{1-v}P_v$ current spreading layer is 3 micrometers or more.

3. An AlGaInP light emitting device as described in claim 1, wherein w and v in said second conductivity-type $Al_wGa_{1-w}As_{1-v}P_v$ current spreading layer are in the ranges of $0.45 \leq w < 1$ and $0 < v \leq 0.08$, respectively.

4. An AlGaInP light emitting device as described in claim 1, wherein said active layer is made of $(Al_yGa_{1-y})_{0.51}In_{0.49}P$ mixed crystal, in which y is in the range of $0 \leq y \leq 0.7$.

* * * * *